(12) United States Patent
Toyoda et al.

(10) Patent No.: US 6,649,988 B2
(45) Date of Patent: Nov. 18, 2003

(54) SEMICONDUCTOR PRESSURE SENSOR DECREASING CREEP STRESS IN <110> CRYSTALLINE AXIS DIRECTION

(75) Inventors: Inao Toyoda, Anjo (JP); Takahiko Yoshida, Okazaki (JP); Kiyonari Oda, Gamagori (JP)

(73) Assignees: Nippon Soken, Inc., Nishio (JP); Denso Corporation, Kariya (JP)

( * ) Notice: Subject to any disclaimer, the term of this patent is extended or adjusted under 35 U.S.C. 154(b) by 0 days.

(21) Appl. No.: 10/122,377

(22) Filed: Apr. 16, 2002

(65) Prior Publication Data

US 2002/0167058 A1 Nov. 14, 2002

(30) Foreign Application Priority Data

May 10, 2001 (JP) ......................... 2001-140556

(51) Int. Cl.[7] .......................... H01L 29/82; H01L 29/84
(52) U.S. Cl. ................ 257/417; 257/108; 257/252; 257/254; 257/414; 257/415; 257/418; 257/419; 257/420; 257/619
(58) Field of Search ................ 257/108, 414, 257/415, 417, 418, 419, 420, 252, 254, 619

(56) References Cited

U.S. PATENT DOCUMENTS

| | | | | |
|---|---|---|---|---|
| 4,618,397 A | * | 10/1986 | Shimizu et al. ............. 438/53 |
| 4,975,390 A | * | 12/1990 | Fujii et al. ................. 438/53 |
| 5,081,437 A | * | 1/1992 | Mosser et al. ............... 338/2 |
| 5,186,054 A | * | 2/1993 | Sekimura .................. 73/724 |
| 5,525,549 A | * | 6/1996 | Fukada et al. ............. 438/53 |
| 5,537,882 A | | 7/1996 | Ugai et al. ................. 73/727 |
| 5,622,901 A | * | 4/1997 | Fukada .................... 438/50 |
| 5,643,803 A | * | 7/1997 | Fukada et al. ............. 438/50 |
| 5,654,244 A | * | 8/1997 | Sakai et al. ............... 438/53 |
| 5,770,883 A | * | 6/1998 | Mizuno et al. ............ 257/417 |
| 5,920,106 A | * | 7/1999 | Oba et al. ................ 257/419 |
| 5,932,921 A | * | 8/1999 | Sakai et al. .............. 257/419 |
| 6,020,618 A | * | 2/2000 | Sakai ...................... 257/419 |

FOREIGN PATENT DOCUMENTS

JP          A-7-55619          3/1995

* cited by examiner

*Primary Examiner*—Amir Zarabian
*Assistant Examiner*—Ida M. Soward
(74) *Attorney, Agent, or Firm*—Posz & Bethards, PLC

(57) ABSTRACT

Metal wiring segments, which are located at peripheral positions of a diaphragm, are formed on a main surface of a thick portion of a semiconductor substrate. A ratio S/d is larger than 100, where an area of the diaphragm is S $\mu m^2$ and a thickness thereof is d $\mu m$. Further, a total area of the metal wiring segments arranged on first sides of the substrate is larger than total area of the metal wiring segments arranged on second sides of the substrate, where the first sides indicate the sides in parallel with <110> crystalline axis and the second sides indicate the sides in parallel with <100> crystalline axis.

6 Claims, 8 Drawing Sheets

US 6,649,988 B2

SEMICONDUCTOR PRESSURE SENSOR DECREASING CREEP STRESS IN <110> CRYSTALLINE AXIS DIRECTION

CROSS REFERENCE TO RELATED APPLICATION

This application is based upon and claims the benefit of Japanese Patent Application No. 2001-140556 filed on May 10, 2001, the contents of which are incorporated herein by reference.

1. Field of the Invention

The present invention relates to a semiconductor pressure sensor, and specifically to a semiconductor pressure sensor that can detect minute pressure.

2. Background of the Invention

Generally, a semiconductor pressure sensor includes a semiconductor substrate, a diaphragm and diffusion gauge resistors. The diaphragm is formed in the main surface of the substrate. The diffusion gauge resistors are formed by ion implantation and diffusion. Then, a detection signal corresponding to pressure applied to the diaphragm can be generated based on a resistance value change of the diffusion gauge resistors.

Furthermore, in a thick outer portion of the diaphragm, metal wiring is formed on the main surface of the substrate for electrically connecting the diffusion gauge resistors to a component outside of the substrate and for outputting the pressure signal through the diffusion gauge resistors.

Such a semiconductor pressure sensor is typically made with a substrate having a (110) surface as the main surface (hereinafter referred to as a 110 type substrate), because the influence of thermal stress on the 110 type substrate is smaller than on a substrate having a (100) surface as the main surface (hereinafter referred to a 100 type substrate).

Further, the following limitations are associated with a semiconductor pressure sensor using the 110 type substrate to improve its sensitivity.

Namely, the metal wiring formed on the thick portion is made by depositing Al (aluminum) or the like, but creep stress generated in the metal wiring is supplied to the diaphragm. Therefore, the stress changes the sensor output. For example, the sensor is subjected to high temperature in a bonding process for adhering the sensor to a case. However, when the sensor is returned to room temperature after application of heat, the thermal stress of the metal wiring is moderated over several hundred hours. Then, stress generated based on the creep stress in the metal wiring is supplied the diaphragm, and the sensor output fluctuates so that the diaphragm is deformed thereby. Therefore, the sensor output includes an error even if trimming is done to the sensor to adjust the output thereof after the bonding process.

As for an intermediate sensor detecting range (e.g., 100 kPa), the problem of the output change by creep stress of the metal wiring is not conspicuous because an offset of the sensor output is small.

However, it has been proven that, for example, an offset of the sensor output caused by creep stress of the metal wiring may be approximately 1 FS %.

SUMMARY OF THE INVENTION

It is therefore an object of the present invention to provide a semiconductor pressure sensor that is capable of obviating the above problem.

It is another object of the present invention to provide a semiconductor pressure sensor that is capable of repressing output change due to creep stress of the metal wiring segments.

If a thin diaphragm having a large area can be adapted, it will be possible to realize a semiconductor pressure sensor that can detect minute pressure. A semiconductor pressure sensor having a ratio S/d is larger than 100, where an area of the diaphragm 12 is S$\mu$m$^2$ and a thickness thereof is d$\mu$m. In this constitution, minute pressures as small as 10 kPa can be detected.

As shown in FIG. 3, there are two perpendicular crystalline axes, i.e., <110> and <100> crystalline axes, that run at right angles relative to one another in the (110) surface that is the main surface of the diaphragm.

Further, the stress sensitivity of the direction of the <110> crystalline axis is much larger than that of the direction of the <100> crystalline axis. For example, the former is fifty times more sensitive than the latter. That is, a piezoresistance coefficient of the direction of the <110> crystalline axis is larger than that of the direction of the <100> crystalline axis. Therefore, the <110> crystalline direction is used for pressure detection on the (110) surface.

As the direction of the <110> crystalline axis exists only in the (110) surface, diffusion gauge resistors have to be arranged as shown in FIG. 3 if higher output is gained using the direction of the <110> crystalline with high sensitivity. Namely, center gauges are arranged close to the center of the diaphragm, and side gauges are arranged at peripheral position of the diaphragm in comparison with the center gauges. Further, a bridge circuit includes by the four diffusion gauge resistors by which stress generated in the direction of the <110> crystalline is detected.

Accordingly, the present invention is created under the above presupposition to decrease creep stress that acts in the direction of the <100> crystalline axis.

According to the present invention, metal wiring segments arranged peripherally on the diaphragm are formed on a main surface of a thick portion of a semiconductor substrate. A ratio S/d is larger than 100, where an area of the diaphragm is S$\mu$m$^2$ and a thickness thereof is d$\mu$m. Further, the total area of the metal wiring segments arranged on first sides is larger than the total area of the metal wiring segments arranged on second sides, where the first sides indicate the sides in parallel with the <110> crystalline axis and the second sides indicate the sides in parallel with the <100> crystalline axis.

When the metal wiring segments are primarily arranged on the side of the first sides in parallel with the <110> crystalline axis, the creep stress in the metal wiring segments, which acts on the diaphragm, mainly acts in the direction of the <100> crystalline axis. Therefore, the creep stress that acts the direction of the <110> crystalline axis relatively decreases.

Therefore, in the semiconductor pressure sensor having the diaphragm that is constructed with the 110 type substrate, a change of the sensor output based on the creep stress in metal wiring segments can be repressed when the sensor that can detect minute pressure is employed as the semiconductor pressure sensor.

BRIEF DESCRIPTION OF THE DRAWINGS

Other objects, features and advantages of the present invention will be understood more fully from the following detailed description made with reference to the accompanying drawings. In the drawings.

DETAILED DESCRIPTION OF THE PREFERRED EMBODIMENT

Figure 1:
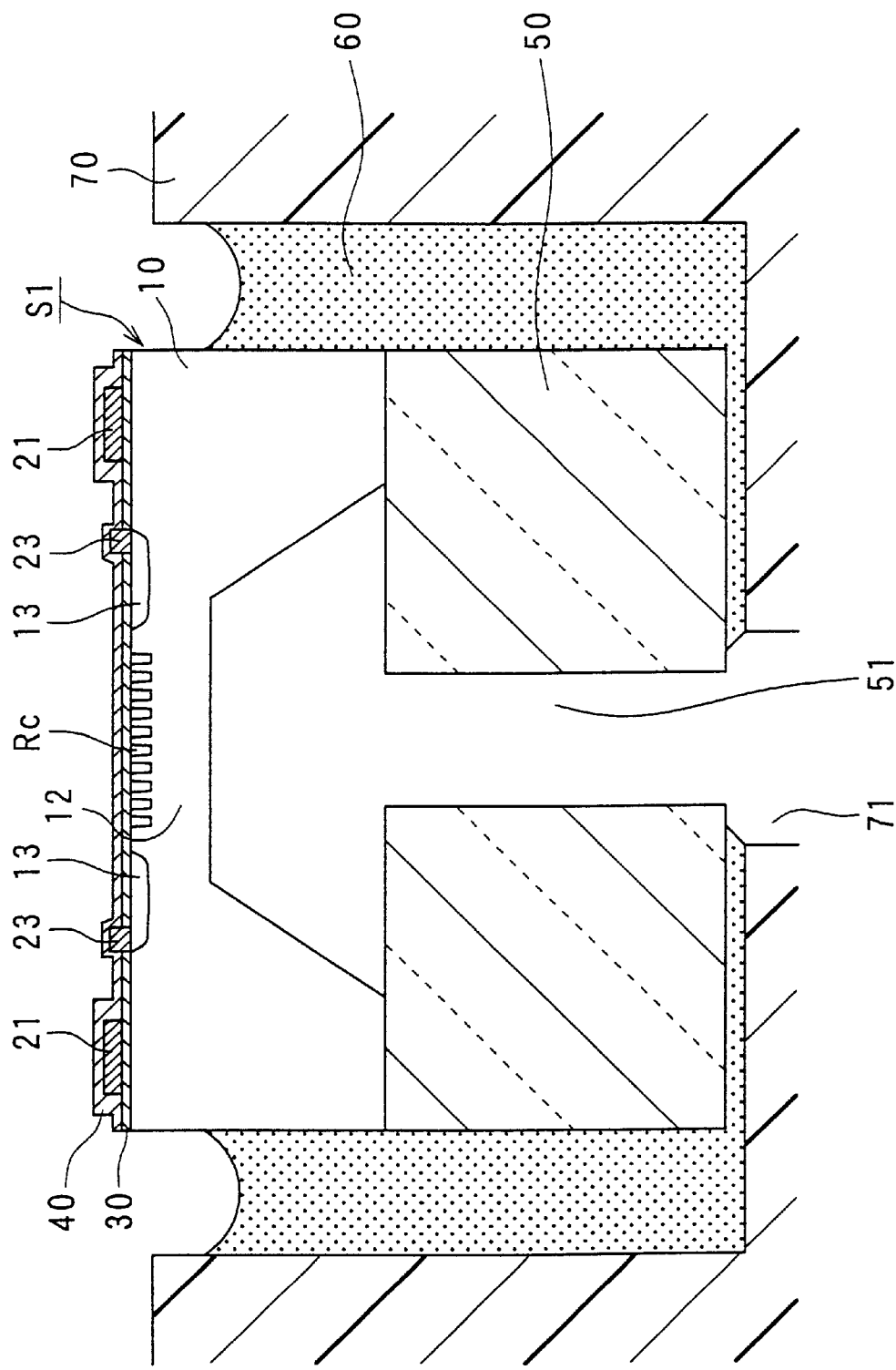
FIG. 1 is a cross sectional view showing a semiconductor pressure sensor according to a first embodiment of the present invention.

The present invention will be described further with reference to various embodiments shown in the drawings.

First Embodiment

Figure 2:
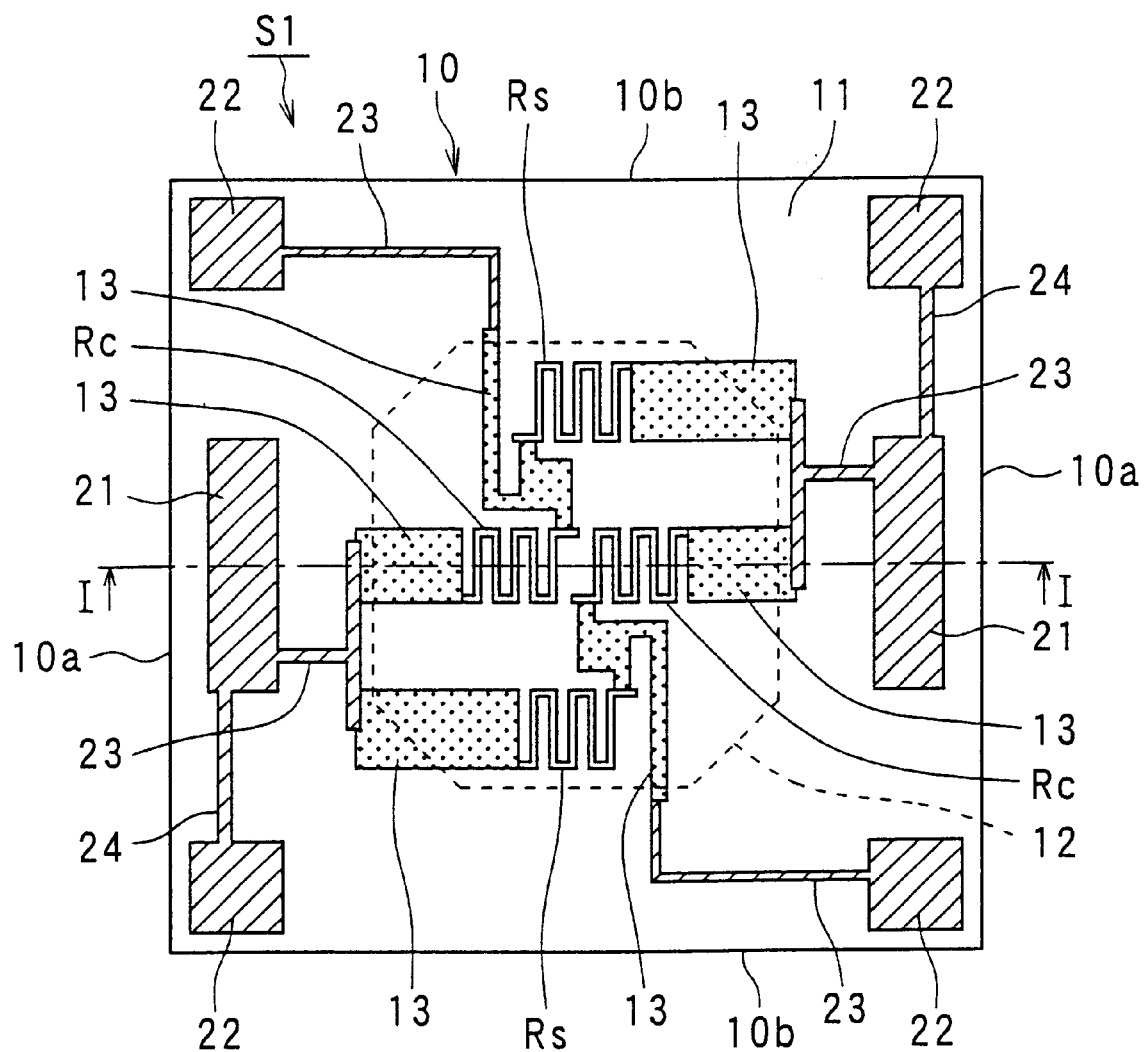
FIG. 2 is a front view showing the pressure sensor of FIG. 1.

Referring to FIGS. 1 and 2, a semiconductor pressure sensor S1 is produced by using well-known semiconductor production technology for a plane rectangular silicon substrate 10 having a main surface 11 whose plane direction is the (100) plane. The pressure sensor S1 detects minute pressures as small as, for example, 10 kPa.

In the silicon substrate 10, a reentrant is formed from a receive surface of the main surface 11 by anisotropy etching with an alkali solution or the like. A bottom of the reentrant forms a diaphragm 12 for detecting pressure.

As shown in FIG. 2, the shape of diaphragm 12 is an octagon sectioned by the sides that are perpendicular to <100> crystalline axis, <110> crystalline axis, and <111> crystalline axis. However, it may alternatively be formed in the shape of a quadrangle, a circle or the like. The diaphragm 12 is sized so as to enable it to detect minute pressures on the order of, for example, 10 kPa. For example, when the area of the diaphragm 12 is $S \mu m^2$ and the thickness thereof is $d \mu m$, a ratio S/d is set larger than 100. Specifically, S is $1.8 \times 10^6 \ \mu m^2$, and d is $13 \mu m$.

Figure 3:
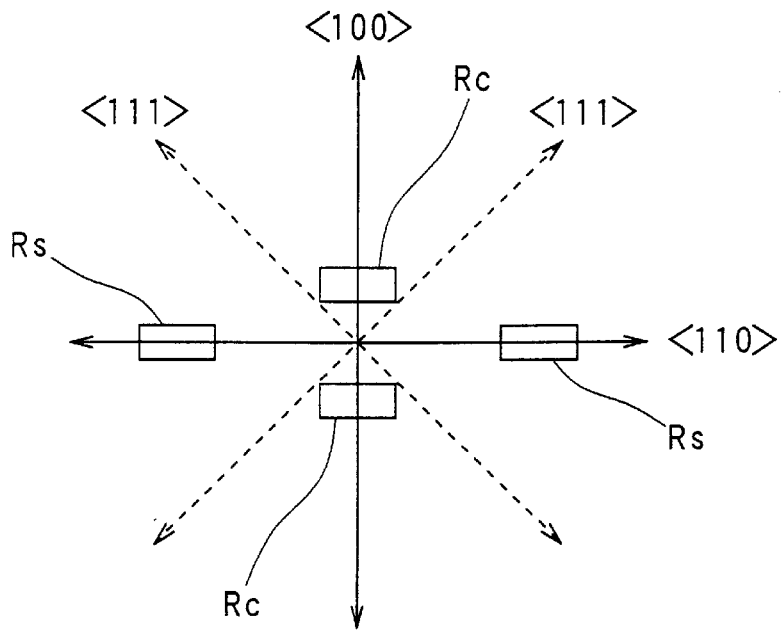
FIG. 3 is a schematic view showing a crystalline axis at a main surface of the pressure sensor of FIG. 1.

A plurality of diffusion gauge resistors Rc, Rs are formed in the diaphragm 12. The diffusion gauge resistors Rc, Rs are used for outputting a detection signal that changes based on a change in a resistance value caused by deformation of the diaphragm 12. As shown in FIGS. 2, 3, the diffusion gauge resistors Rs, Rc include two center gauges Rc and two side gauges Rs. Each center gauge Rc is arranged close to a center of the diaphragm 12. Each side gauge Rs is arranged at a peripheral position of the diaphragm 12 in comparison with the center gauges Rc. Further, the respective diffusion gauge resistors Rs, Rc are arranged along the <110> crystalline axis, which is the high sensitivity direction.

The high sensitivity diffusion gauge resistors Rc, Rs are formed by ion implantation into the main surface 11 and diffusion of the implanted ions. The diffusion gauge resistors Rc, Rs are electrically connected to diffusion wiring layers 13 (illustrated by hatching in FIG. 2, FIGS. 5, 7–9 are similar, too) that are formed equally by ion implantation into the main surface 11 and by diffusion of the implanted ions. The above-mentioned crystalline axis at a main surface of the pressure sensor S1 is shown in FIG. 3.

Figure 4:
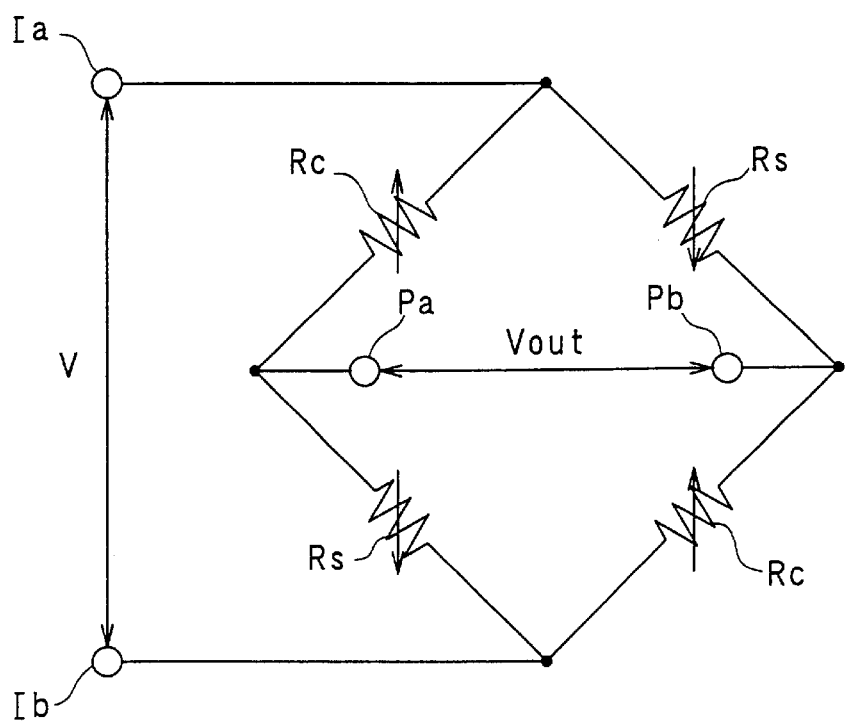
FIG. 4 is an electric circuit view of the pressure sensor of FIG. 1.

Inter-connection of the diffusion gauge resistors Rc, Rs is shown in FIG. 4. As for the diffusion gauge resistors Rc, Rs, a resistance value change of the resistance Rc is opposite to that of resistance Rs. Further, each diffusion gauge resistor Rc, Rs is mutually connected in series by diffusion wiring layer 13 (FIG. 1). Therefore, a Wheatstone-bridge circuit with a quadrilateral closed circuit is constructed.

In the circuit shown in FIG. 4, when a fixed direct voltage is applied between input terminals Ia, Ib, deformation of the diaphragm 12 represented as a resistance value change of the diffusion gauge resistors Rc, Rs. An output voltage (a detection signal) Vout, which corresponds to the pressure applied to the diaphragm 12, is output between output terminals Pa, Pb.

As shown in FIGS. 1 and 2, metal wiring segments 21–24 are formed on the main surface 11 of a thick portion of the diaphragm 12. The metal wiring segments 21–24 connect diffusion gauge resistors Rc, Rs to component outside of the pressure sensor S1 and are used to apply a voltage to the bridge circuit formed from the diffusion gauge resistors Rc, Rs. Moreover, the metal wiring segments 21–24 are used as output lines of the search signal Vout from the bridge circuit.

In FIG. 2, the metal wiring segments 21–24 specifically include rectangular segments 21, metal pads 22, drawer segments 23 and connection segments 24. The rectangular segments 21 form a resistance element and are used to receive an applied substrate electric potential. Respective areas of the rectangular segments 21 are larger than the other metal wiring segments 22–24. The metal pads 22 are used to connect non-sensor components to the outside of the pressure sensor S1. The metal pads 22 are connected with bonding wire. The drawer segments 23 electrically connect to the diffusion gauge resistors Rc, Rs via the diffusion wiring layers 13. The connection segments 24 electrically connect the metal pads 22 to rectangular segments 21. Incidentally, in FIG. 2, the metal wiring segments 21–24 are shown by slanted line hatching (FIGS. 5, 7–9 are similar, too).

As shown in FIG. 1, the metal wiring segments 21–24 are formed on an insulation layer 30 such as silicon oxidation layer that is formed on the main surface 11 of the silicon substrate 10. For example, the metal wiring segments 21–24 are formed by vapor deposition or the like using aluminum. The drawer seguments 23 are electrically connected to the diffusion wiring layers 13 via contact holes formed through the insulation layer 30. In addition, it is preferable that the metal wiring segments 21–24 are made so as to be spaced from an edge of the diaphragm 12 by a distance of more than 100 $\mu m$ on thick portion of the diaphragm 12.

A passivating layer 40 for protecting the pressure sensor S1 covers the metal wiring segments 21–24 and insulation layer 30. The passivating layer 40 is made of silicon nitride or the like openings (not shown) are formed at a part of the passivating layer 40 above the metal pads 22. The metal pads 22 electrically connect to outside non-sensor components (not shown) of the pressure sensor S1 via the openings.

The semiconductor pressure sensor S1 can be made by any well-known semiconductor production method. As shown in FIG. 1, the resulting pressure sensor S1 is bonded into a case 70. A glass pedestal 50 is joined on the reverse side of the silicon substrate 10 by anode joining or the like. The glass pedestal 50 is fixed on the case 70 by an adhesive 60 made of silicon resin.

The case 70 is used to install the pressure sensor S1 in the right position of a measurement target. The case 70 is formed from PPS (polyphenylene sulfide), PBT (polybutylene terephthalate) or the like. The case 70 has a communication passage 71 for introducing pressure from a measurement target (not shown).

Further, a through hole 51 for introducing the pressure to the reverse side of the diaphragm 12, and which communicates with the communication passage 71, is formed at the glass pedestal 50.

Accordingly, the pressure of the measurement target is introduced to the pressure sensor S1 through the reverse side of the diaphragm 12 via the communication passage 71 and through hole 51. The pressure of the measurement target is applied to the diaphragm 12, and, therefore, the diaphragm 12 is deformed. The diffusion gauge resistors Rc, Rs change their resistance value due to deformation of the diaphragm 12 in the direction of the <110> crystalline axis.

The search signal Vout changes based on the resistance value changes in the diffusion gauge resistors Rc, Rs. The detection signal Vout is transmitted to an outside circuit (not shown) via metal pads 22. Then, the detection signal Vout is processed at the outside circuit, and the resulting signal is used as a final output signal.

Further, in the present embodiment, the following structure is utilized to repress the creep stress in the metal wiring segments 21–24 that acts in the direction of the <110> crystalline axis.

As mentioned above, the pressure sensor Si is exposed to high temperatures (e.g., 140° C.) to harden the adhesive 60 and to therefore secure pressure sensor Si to the case 70. However, when the pressure sensor Si is returned to room temperature after the application of heat, the thermal stress of the metal wiring segments 21–24 is moderated over a time period of several hundred hours. Then, stress generated based on the creep stress in metal wiring segments 21–24 is supplied to the diaphragm 12, and the sensor output fluctuates so that the diaphragm 12 is deformed.

Accordingly, as shown in FIG. 2, the total area of the metal wiring segments 21, 22, 24 arranged on first sides 10a is larger than the total area of the metal wiring segments 22, 23 arranged on second sides 10b. Here, the first sides 10a indicate the sides in parallel with the <110> crystalline axis, and the second sides 10b indicate the sides in parallel with the <100> crystalline axis.

Namely, the metal wiring segments 21, 22, 24 arranged on the first sides 10a indicate metal wiring that is closer the first sides 10a than the second sides 10b. The metal wiring segments 22, 23 arranged on the second sides 10b indicate metal wiring that are closer the second sides 10b than the first sides 10a. This is obviousness from an arrangement form of the metal wiring segments 21–24 shown in FIG. 2.

When the metal wiring segments 21–24 are primarily arranged on the first sides 10a in parallel with the <110> crystalline axis, the creep stress in the metal wiring segments 21–24, which acts on the diaphragm 12, mainly acts in the direction of the <100> crystalline axis. Therefore, the creep stress that acts the direction of the <110> crystalline axis relatively decreases.

Specifically, the thick portion that is hard to transform is formed in the direction of the <110> crystalline axis while the thin diaphragm 12 that is easy to transform is formed in the direction of the <100> crystalline axis, when viewed from metal wiring segments 21, 22, 24 that is arranged on the first sides 10a in parallel with the <110> crystalline axis.

Therefore, the deformation of the silicon substrate 10 based on the creep stress in the metal wiring segments 21, 22, 24 arranged on the first sides 10a is primarily generated in the direction of the <100> crystalline axis. On the other hand, the transform of the silicon substrate 10 based on the creep stress in the metal wiring segments 22, 23 arranged on the second sides 10b is primarily generated in the direction of the <110> crystalline axis.

In this embodiment, the total area of the metal wiring segments 21, 22, 24 arranged on a first sides 10a is larger than the total area of the metal wiring segments 22, 23 arranged on the second sides 10b. Therefore, the creep stress in the metal wiring segments 21–24 that acts on the diaphragm 12 mainly acts in the direction of the <100> crystalline axis, so that the creep stress that acts the direction of the <100> crystalline axis relatively decreases.

According to this embodiment, in the semiconductor pressure sensor S1 having the diaphragm 12 that is constructed by the 110 type substrate, a change of the sensor output based on the creep stress in the metal wiring segments 21–24 can be repressed when a sensor that can detect minute pressure is utilized as the semiconductor pressure sensor S1.

Figure 5:
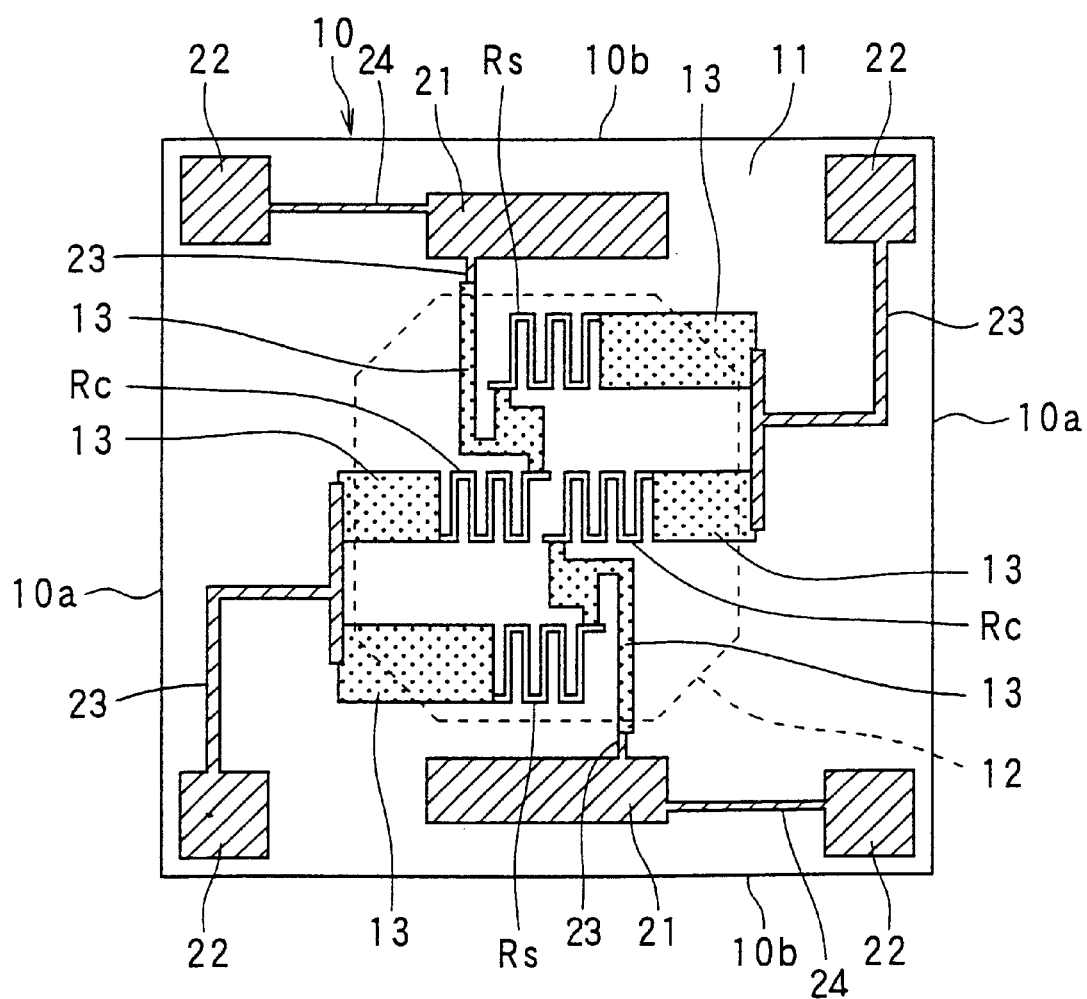
FIG. 5 is a front view showing a reference semiconductor pressure sensor.

A further advantage of the sensor output that is obtained by the arrangement form of the metal wiring segments 21–24 in this embodiment will now be described. As a comparative example, a semiconductor pressure sensor is shown in FIG. 5.

In this comparative example, the rectangular segments 21 having large area were arranged on the second sides 10b opposite that shown in FIG. 2, i.e., the total area of the metal wiring segments 21, 22, 24 arranged on the second sides 10b were larger than the total area of the metal wiring segments 22, 23 arranged on the first sides 10a.

Figure 6A:
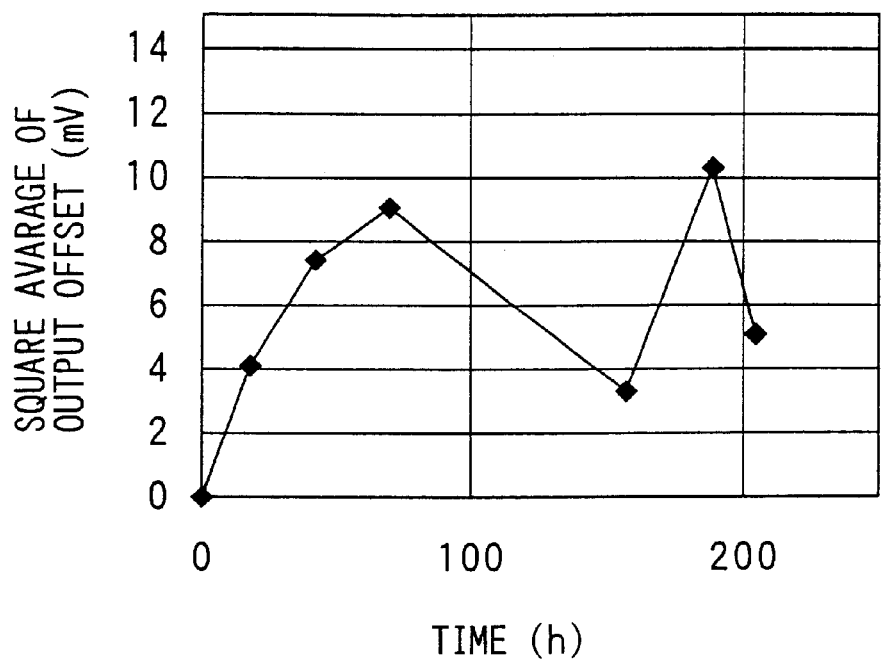
FIG. 6A is a line graph showing a relationship between time and square average of output offset of the pressure sensor in the first embodiment.
Figure 6B:
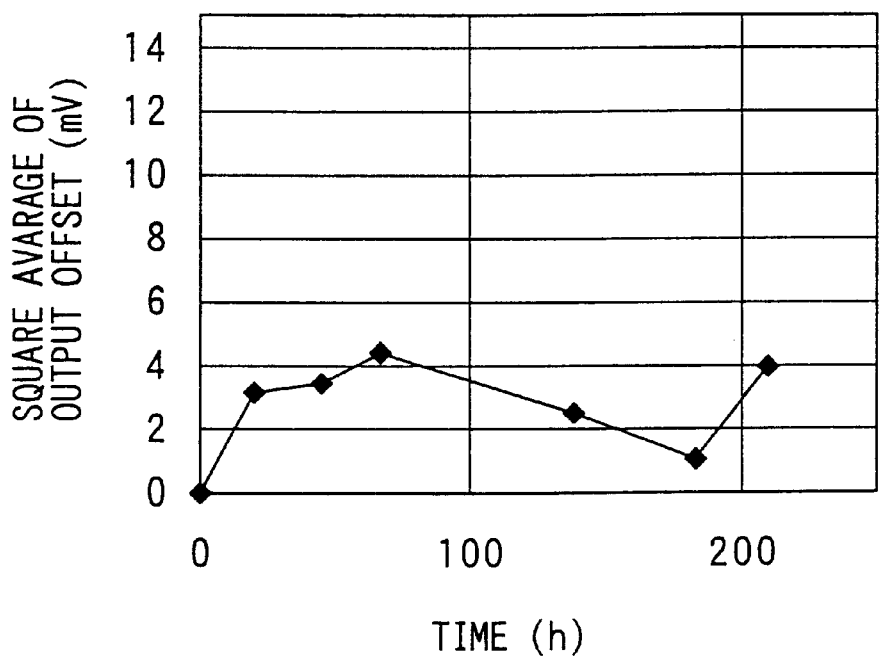
FIG. 6B is a line graph showing a relationship between time and square average of output offset of the pressure sensor of FIG. 5.

First, the pressure sensors of this embodiment and the comparative example were heated by 140° C. for two hours and were then cooled to room temperature. Then, respective changes of the sensor outputs were searched. FIGS. 6A, 6B indicate the results. In FIGS. 6A, 6B, a square average of offset change that was amplified 1300 times as the sensor output by an amplifier was used as change of sensor offset as against time (unit: hour).

As shown in FIGS. 6A, 6B, in the comparative example, the creep stress in the metal wiring segments 21–24 that acted on the diaphragm 12 acted in the direction of the <100> crystalline axis. Thus, the change of the sensor output increased. To the contrary, in the pressure sensor S1 of this embodiment, the change of the sensor output decreased.

Further, in this embodiment, the diffusion gauge resistors Rc, Rs of the pressure sensor using the 110 type substrate has center gauges Rc and side gauges Rs arranged along the <110> crystalline axis.

Moreover, the total area of the metal wiring segments 21, 22, 24 arranged on first sides 10a is larger than the total area of the metal wiring segments 22, 23 arranged on second sides 10b. In the pressure sensor S1 of this embodiment, many of the areas of the metal wiring segments 21–24 can be arranged at a far side from the diffusion gauge resistors Rc, Rs in comparison with the comparative example.

Accordingly, it is possible that the creep stress in the metal wiring segments 21–24 is minimally transmitted to the diffusion gauge resistors Rc, Rs. This also contributes to an increase in accuracy of the sensor output.

Second Embodiment

Figure 7:
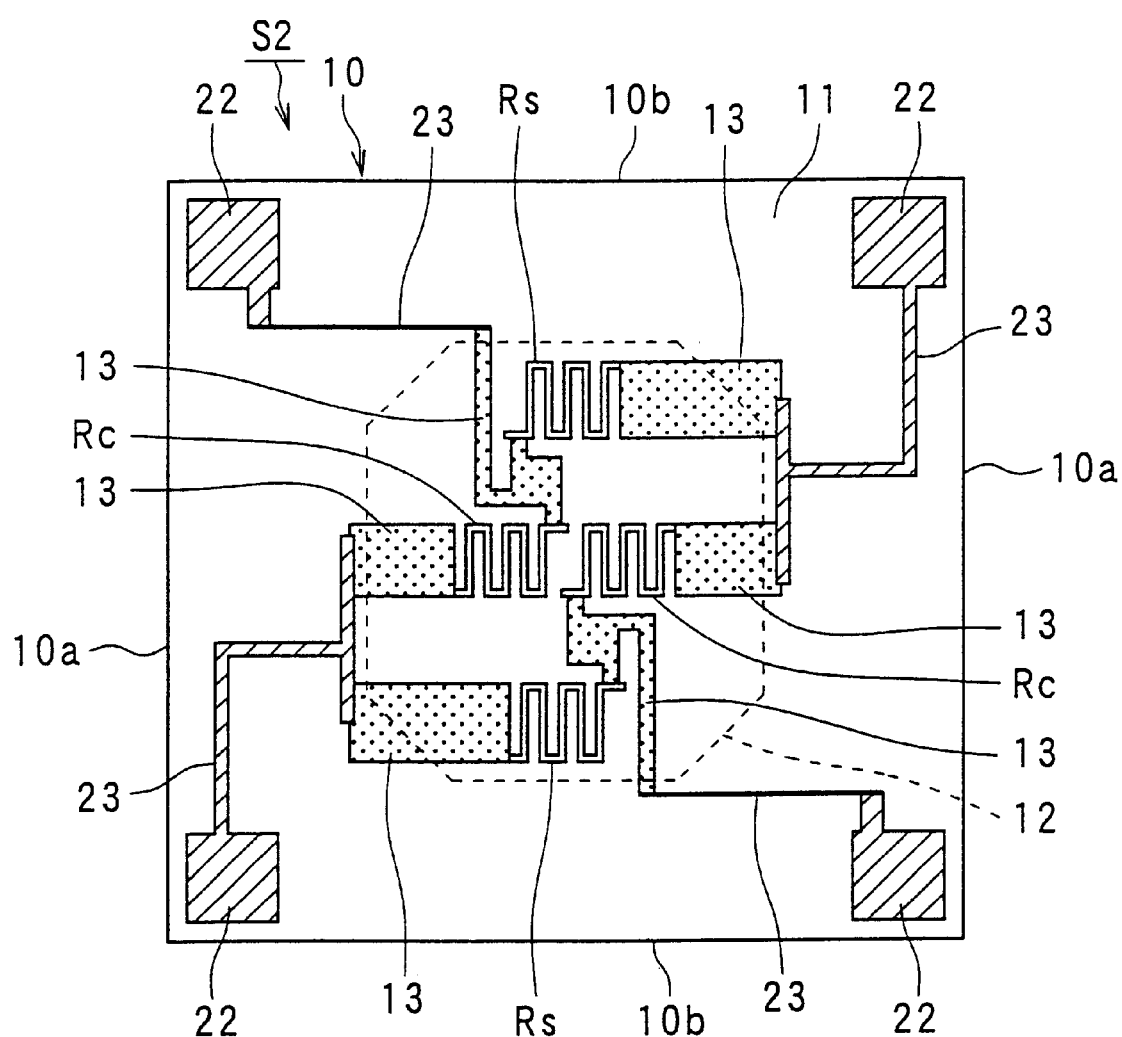
FIG. 7 is a front view showing a semiconductor pressure sensor according to a second embodiment.

A semiconductor pressure sensor S2 shown in FIG. 7 represents a modification of the pressure sensor S1 of the first embodiment. As shown in FIG. 7, this embodiment does not have the rectangular segments 21 shown in FIG. 2. Namely, the metal wiring includes only metal pads 22, drawer segments 23 and connection segments 24.

In this case, apart of each of the drawer segments 23 arranged on the first sides 10a is also wider than a part of each of the drawer segments 23 arranged on the second sides 10b. Accordingly, it is possible to obtain the same advantage as the first embodiment.

Third Embodiment

Figure 8:
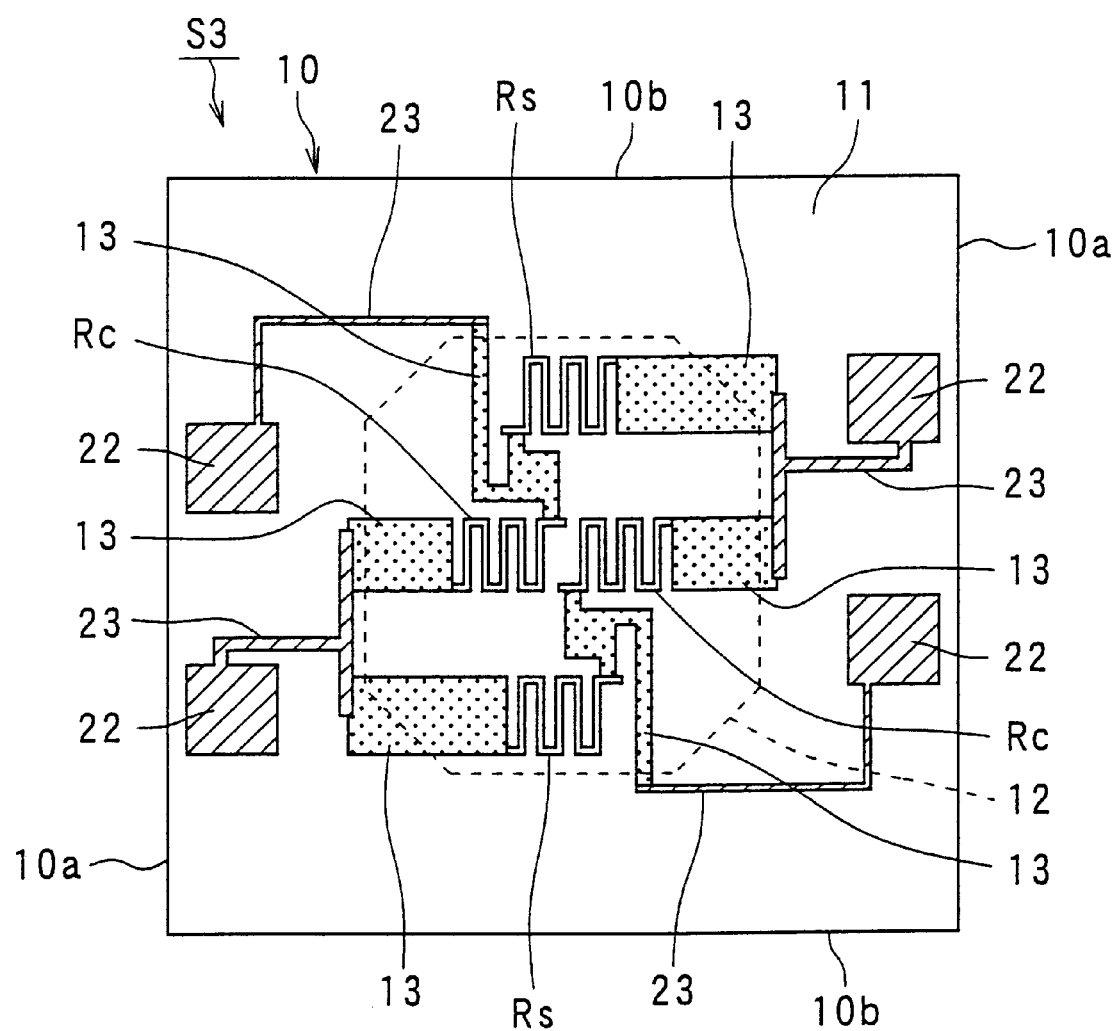
FIG. 8 is a front view showing a semiconductor pressure sensor according to a third embodiment.

A semiconductor pressure sensor S3 shown in FIG. 8 represents a modification of the pressure sensor S1 of the second embodiment. Specifically, metal pads 22 are only arranged on the first sides 10a.

It is preferable that the total area of the metal pads 22 arranged on first sides 10a is larger than the total area of the metal pads 22 arranged on second sides 10b, because the metal pads 22 are formed as the metal wiring segments. Especially, as shown in FIG. 8, it is more preferable that all of the metal pads 22 are arranged on the first sides 10a.

That is, the metal pads 22 represent a relatively large portion of the metal wiring segments. Accordingly, in this embodiment, the creep stress in the metal pads 22 that acts the diaphragm 12 mainly acts the direction of the <100> crystalline axis, which is virtually unrelated output sensitivity.

Therefore, the total area of the metal wiring segments arranged on first sides 10a is larger than the total area of the metal wiring segments arranged on second sides 10b. Thus, it is possible to efficiently obtain the same advantage as the first embodiment.

Fourth Embodiment

Figure 9:
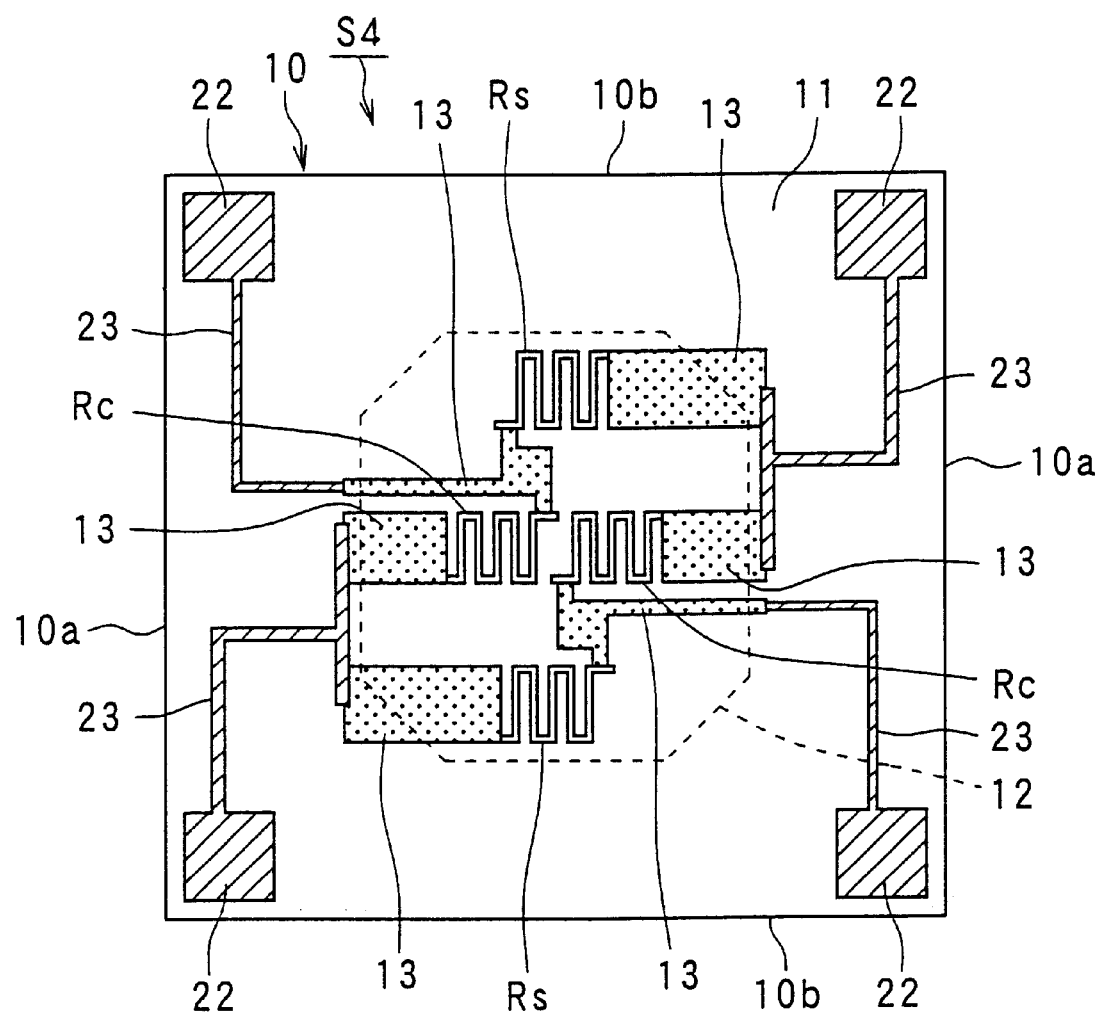
FIG. 9 is a front view showing a semiconductor pressure sensor according to a modification.

A semiconductor pressure sensor S4 shown in FIG. 9 represents yet another modification of the pressure sensor S1 of the second embodiment. Specifically, drawer segments 23 are only placed on first sides 10a from the diffusion gauge resistors Rc, Rs.

According to this embodiment, the total area of the metal wiring segments arranged on the first sides 10a is larger than the total area of the metal wiring segments arranged on the second sides 10b. Thus, it is possible to efficiently obtain the same advantage as the first embodiment.

While the above description is of the preferred embodiment of the present invention, it should be appreciated that the invention may be modified, altered, or varied without deviating from the scope and fair meaning of the following claims.

What is claimed is:

1. A semiconductor pressure sensor comprising:
   a rectangular semiconductor substrate having a (110) surface as a main surface;
   a diaphragm formed on the main surface;
   diffusion gauge resistors formed on the diaphragm for outputting a detection signal based on changes in resistance values thereof according to deformation of the diaphragm; and
   metal wiring segments formed on the main surface of a thick portion of the substrate, which is a peripheral area of the diaphragm;
   wherein, a ratio S/d is larger than 100, where an area of the diaphragm is S $\mu m^2$ and a thickness thereof is d $\mu m$,
   a total area of the metal wiring segments arranged on first sides of the substrate is larger than a total area of the metal wiring segments arranged on second sides of the substrate, when the first sides indicate the sides in parallel with a <110> crystalline axis and the second sides indicate the sides in parallel with a <100> crystalline axis.

2. A semiconductor pressure sensor as in claim 1, wherein the metal wiring segments have a plurality of metal pads arranged on the thick portion for making external connections, and a total area of the metal pads arranged on the first sides is larger than a total area of the metal pads arranged on the second sides.

3. A semiconductor pressure sensor as in claim 1, wherein the metal wiring segments are placed on the first sides and the second sides and a width of the metal wiring segments placed on the first sides is wider than that of the metal wiring segments placed on the second sides.

4. A semiconductor pressure sensor as in claim 1, wherein the metal wiring segments are drawn over only the first sides.

5. A semiconductor pressure sensor comprising:
   a rectangular semiconductor substrate having a (110) surface as a main surface, first sides in parallel with a <110> crystalline axis and second sides in parallel with a <100> crystalline axis;
   a diaphragm formed on the main surface, wherein the substrate further has a thick portion formed around a periphery of the diaphragm;
   diffusion gauge resistors formed on the diaphragm for outputting a detection signal based on changes in resistance values thereof according to deformation of the diaphragm; and
   metal wiring segments formed on the thick portion of the substrate;
   wherein, a ratio S/d is larger than 100 $\mu m$, where an area of the diaphragm is S $\mu m^2$ and a thickness thereof is d $\mu m$,
   a total area of the metal wiring segments arranged closer to the first sides than the second sides is larger than a total area of the metal wiring segments arranged closer to the second sides than the first sides.

6. A semiconductor pressure sensor as in claim 5, wherein the metal wiring segments have a plurality of metal pads for making external connections and arranged on the thick portion, and all of the metal pads are arranged on the first sides closer than the second sides.

* * * * *